(12) United States Patent
Jacobsen

(10) Patent No.: US 7,463,118 B2
(45) Date of Patent: Dec. 9, 2008

(54) PIEZOELECTRIC RESONATOR WITH AN EFFICIENT ALL-DIELECTRIC BRAGG REFLECTOR

(75) Inventor: Stuart M. Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 307 days.

(21) Appl. No.: 11/450,088

(22) Filed: Jun. 9, 2006

(65) Prior Publication Data

US 2007/0285191 A1 Dec. 13, 2007

(51) Int. Cl.
*H03H 9/15* (2006.01)
*H01L 41/08* (2006.01)

(52) U.S. Cl. ...................... 333/187; 310/335

(58) Field of Classification Search ............ 333/187, 333/189, 191; 310/335, 320, 326, 327
See application file for complete search history.

(56) References Cited

U.S. PATENT DOCUMENTS 6,841,922 B2 * 1/2005 Aigner et al. .............. 310/335

OTHER PUBLICATIONS

Naik et al., "IEEE Transactions on Ultrasonics, Ferroelectrics, and Frequency Control, vol. 47, No. 1", "Measurements of the Bulk, C-Axis Electromechanical Coupling Constant as a Function of AIN Film Quality", Jan. 2000, pp. 292-296.*

* cited by examiner

*Primary Examiner*—Daniel D Chang
(74) *Attorney, Agent, or Firm*—Wade J. Brady, III; Frederick J. Telecky, Jr.

(57) ABSTRACT

A piezoelectric resonator with an acoustic Bragg reflector that includes alternating layers of high and low acoustic impedance materials. The high and low acoustic impedance dielectric materials make up electrically insulating layers.

16 Claims, 3 Drawing Sheets

PIEZOELECTRIC RESONATOR WITH AN EFFICIENT ALL-DIELECTRIC BRAGG REFLECTOR

TECHNICAL FIELD

The present invention relates to a resonator device, and in particular to a resonator device incorporating a piezoelectric resonator accompanied by an acoustic Bragg reflector.

BACKGROUND OF THE INVENTION

Filters are utilized in RF electronic circuits in many important technological applications. In high volume applications such as wireless mobile telecommunications filter technologies today are dominated by Surface Acoustic Wave (SAW) and microwave ceramics. Ceramic filters are both high performance and low cost but they suffer from having a large footprint on a wireless board. SAW filters exhibit size advantages over ceramic filters but suffer from a relatively poor sensitivity to temperature and a limited power handling capability.

The need to reduce cost and size in wireless equipment has led to a continuing need for even smaller and lower cost filters. One class of filter components that has the potential to meet these needs is based on Bulk Acoustic Wave (BAW) devices. Like SAW devices, BAWs use the piezoelectric effect to convert electrical energy into mechanical energy resulting from an applied RF voltage. Unlike SAWs, however, the energy is directed into the bulk. BAW devices have a superior power handling capability compared to SAWs, are less sensitive to surface contamination, and have the potential for a very small footprint.

BAW devices generally operate at their mechanical resonant frequency which is defined as that frequency for which the half wavelength of sound waves propagating in the device is equal to the total device thickness for a given velocity of sound for the material. BAW resonators operating in the GHz, range generally have physical dimensions of tens of microns in diameter with thicknesses of a few microns.

In order to ensure proper functionality, the piezoelectric layer of the BAW device needs to be acoustically isolated from the substrate. In the prior art there are two methods that have been used to achieve this acoustic isolation. The first of these is illustrated in prior art FIG. 1, which shows a typical Thin Film Bulk Acoustic Resonator (FBAR) structure. This type of device is discussed in detail by Ruby et al. (U.S. Pat. No. 6,060,818, issued May 9, 2000). In the FBAR device the acoustic isolation of the piezoelectric layer is achieved by removing the substrate 100 or an appropriate sacrificial layer from beneath the resonating component. The other components of the FBAR device consist of an air gap cavity 110, an insulating oxide layer 120, the piezoelectric layer 130 and the drive electrodes 140. Although FBARs have excellent energy confinement because of the air gap, they are prone to spurious modes being superimposed on the fundamental resonance mode. This is likely because of the free nature of the FBAR resonator and the large number of degrees of freedom present that can support a large number of modes. In addition, FBARs are difficult to manufacture particularly with regard to the packaging of such a structure. Generally a high vacuum is required within a packaged FBAR to allow a high quality factor or Q in the finished device.

The second method of providing acoustic isolation is shown in prior art FIG. 2 which illustrates a Solidly Mounted Resonator (SMR). This type of device is described in detail by Aigner et al. (U.S. Pat. No. 6,841,922, issued Jan. 11, 2005). In terms of robustness, the SMR is superior to the FBAR, given that there is little risk of mechanical damage in any of the standard processes used in dicing, assembly and packaging.

In an SMR device the acoustic isolation is achieved by growing the resonator on top of a highly efficient acoustic reflector. The piezoelectric resonator 160 comprises a piezoelectric layer 170 as well as a set of electrodes 180. An acoustic Bragg reflector 190 is located between the resonator 160 and the substrate 200. The acoustic Bragg reflector consists of a plurality of layers 191 to 197. Layers 191,193,195 and 197 of the acoustic reflector are layers with high acoustic impedance and layers 192, 194 and 196 are layers with low acoustic impedance. The thickness of each of these layers is fixed to be one quarter wavelength of the resonant frequency. The greater the number of alternating layers present in the acoustic Bragg reflector 190 the greater is the efficiency of the reflector. The efficiency of the acoustic Bragg reflector is also dependant on the mismatch between the acoustic impedances. The greater the difference in acoustic impedance between the low and high acoustic impedance materials, the more efficient the reflector. If the materials used in the reflector have only a small difference in acoustic impedance then more alternating layers will be required to achieve the same performance, leading to higher device complexity.

Acoustic impedance is the acoustic analogue of a material's optical index of refraction. Materials with high acoustic impedance are metals such as tungsten (W), platinum (Pt), molybdenum (Mo) or gold (Au). Examples of materials with low acoustic impedance are silicon oxide ($SiO_2$) and aluminum (Al). $W/SiO_2$ layers have been used in prior art devices to produce efficient reflectors. However, there are drawbacks to incorporating a metal into the acoustic Bragg reflector. Since metals such as W are conductive, and in order to avoid parasitic coupling between neighboring resonators on a filter chip, the reflector needs to be patterned. Also, if silicon is used as a substrate, this can induce parasitic capacitive coupling between the resonator bottom electrodes and the substrate through the metal reflector layers. Such coupling degrades the resonator's electrical performance.

These drawbacks of using a metal as one of the components in an acoustic Bragg reflector are well recognized in the art and attempts have been made to use an all-dielectric reflector that would negate the problem associated with parasitic capacitances. For example, Naik et al. (IEEE Trans., Ultrasonics, Ferroelectrics, and Frequency Control, 47(1), 2000, pp. 292-296) employed an all-dielectric reflector consisting of alternating layers of aluminum nitride (Al—N) and $SiO_2$. However, due to the small difference in acoustic impedance between these two materials only a comparatively inefficient reflector can be constructed for the same number of alternating layers used in a metal/$SiO_2$ stack such as $W/SiO_2$.

Thus there is a need to provide a SMR structure which has less problems associated with packaging than an FBAR but which does not suffer from the parasitic capacitance problems that are present in SMRs that utilize metal layers in the acoustic Bragg reflector. There is a further need to provide an SMR structure that uses an all-dielectric acoustic Bragg reflector but at the same time has as high an efficiency for the same number of layers as a metal/$SiO_2$ acoustic Bragg reflector such as a $W/SiO_2$ reflector.

SUMMARY OF THE INVENTION

Pursuant to the present invention, an SMR structure is disclosed which contains a highly efficient all-dielectric acoustic Bragg reflector. The dielectric materials that enable this type of reflector have unusually high acoustic impedances and belong to the family of silicon carbide (SiC), diamond-like-carbon (DLC) and silicon-doped-diamond-like-carbon (Si-DLC) refractory dielectrics. SiC has an acoustic impedance around 90% that of tungsten and almost a factor of 3 larger than aluminum nitride (AlN). Thus an impedance ratio of 7:1 can be obtained with a SiC/SiO$_2$ reflector which compares very favorably with the 8:1 ratio afforded by a tungsten/SiO$_2$ stack. The advantage of using SiC or other high acoustic impedance dielectric in the acoustic Bragg reflector is that a highly efficient reflector can be constructed with the minimum number of alternating layers.

Accordingly it is an aspect of the present invention to provide a method of manufacturing a Solidly Mounted Resonator (SMR) device. The SMR devices have less problems associated with packaging than an FBAR, but which do not suffer from the parasitic capacitance problems that are present in SMRs that utilize metal layers in the acoustic Bragg reflector. The SMR structure can be used as an all-dielectric acoustic Bragg reflector but at the same time can have as high an efficiency for the same number of layers as a metal/SiO$_2$ acoustic Bragg reflector such as a W/SiO$_2$ reflector.

It is another aspect of the present invention to provide an SMR device with a highly reflective acoustic Bragg reflector comprising alternating layers of silicon carbide and silicon oxide.

It is yet another aspect of the present invention to provide an SMR structure that does not suffer from parasitic capacitive coupling with the substrate or other nearby resonators on the device.

Other advantages of the present invention will become apparent to those skilled in the art from the following detailed description of the illustrated embodiments, when read in light of the accompanying drawings.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The following description of the embodiment below is merely an example and is in no way intended to limit the invention or its application or uses. The present invention discloses an SMR resonator device and a method for manufacturing an SMR resonator with a highly efficient all-dielectric acoustic reflector constructed with alternating layers of low acoustic impedance material such as SiO$_2$ and high acoustic impedance material such as SiC, Si-DLC or DLC.

Figure 1:
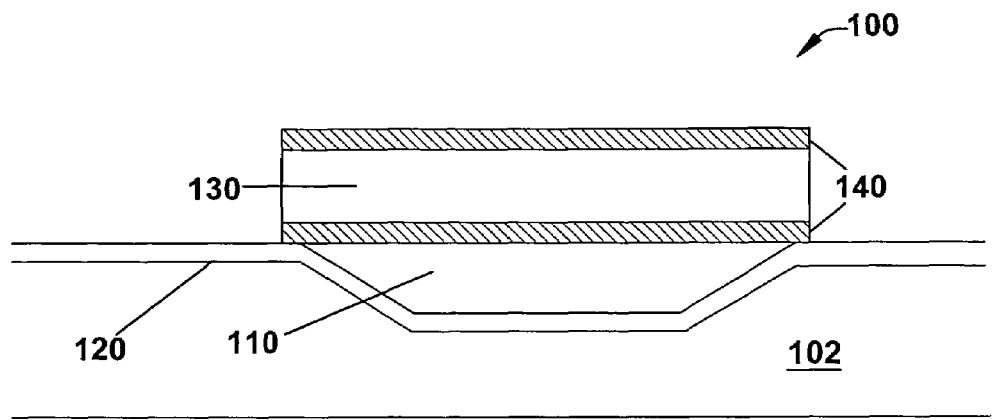
FIG. 1 is a cross-section of a Thin Film Bulk Acoustic Resonator (FBAR)
Figure 2:
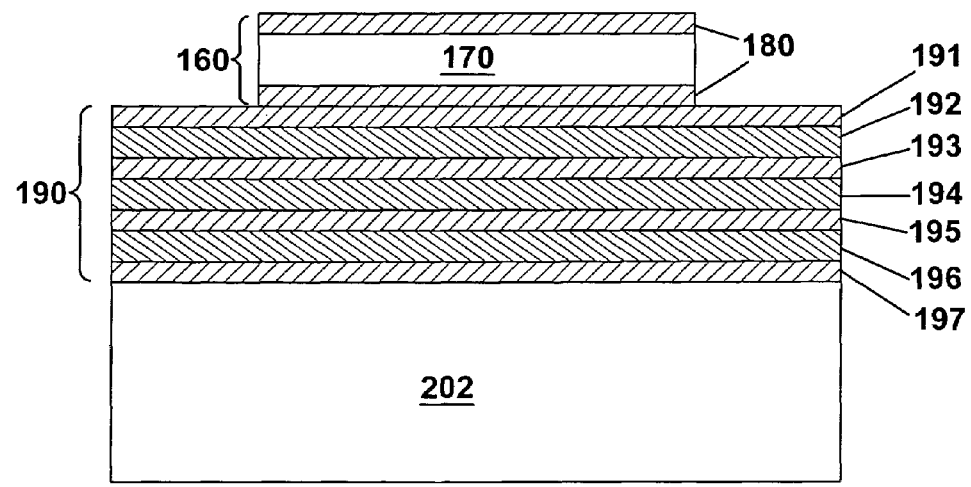
FIG. 2 is a cross-section of a Solidly Mounted Resonator (SMR)
Figure 3:
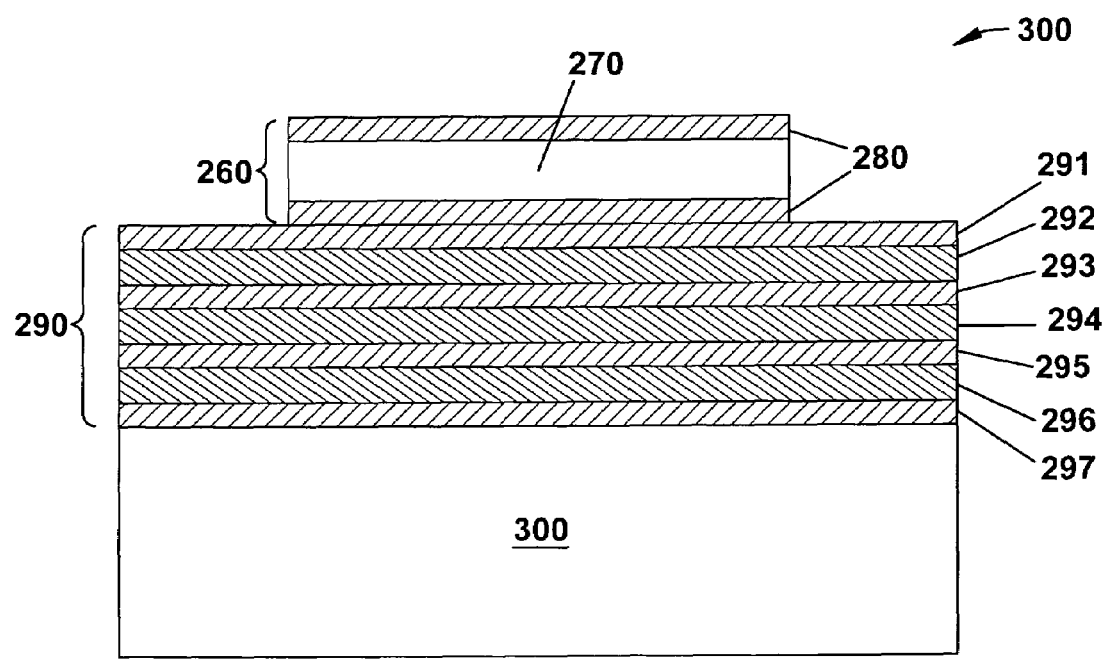
FIG. 3 is a cross-section of the present invention of an SMR with an all dielectric acoustic Bragg reflector using the high acoustic impedance materials disclosed in accordance with one aspect of the present invention.

Referring to FIG. 3, the device begins with a suitable substrate such as a single crystal silicon wafer 300. A first layer of low acoustic impedance material 297 is deposited. In one example the low acoustic impedance material is nanoporous spin-on-glasses of nano-porous hydrogensilsesquioxane (HSQ) or nano-porous methyl silsesquioxane (MSQ) which is deposited in a spin coater with a subsequent curing step. A second layer of high acoustic impedance material 296 is then deposited on top of the first layer 297. If SiC is used, it is deposited, in one example, in a plasma CVD deposition chamber using source gases such as a mixture of methane (CH$_4$) and silane.

If DLC or Si-DLC is used instead of SiC then a modified deposition chamber is employed. DLC is deposited, for example, in a 150 mm parallel plate reactor RFCVD chamber with the upper plate being the gas distribution source and the lower plate being the cathode on which the substrate lies. In this configuration, the upper plate is positive and the cathode is negative (grounded). An RF source, typically 13.56 MHz, is coupled directly to the substrate through the cathode. After the chamber is evacuated, any hydrocarbon gas, typically but not limited to CH$_4$, and/or a Si containing hydrocarbon forming gas if Si-doping is required, typically but not limited to tetramethyidisiloxane (4MS), is introduced into the chamber until the desired pressure is achieved and flow is stable. Other gases such as Ar and H$_2$ can be used in addition to the hydrocarbon forming gases to control the chemical composition of the final DLC film. At this point power is delivered to the cathode to strike a plasma and DLC is deposited for a fixed amount of time until the desired thickness is achieved. Next the power is shut off and the chamber is vented using an inert gas, typically Ar or N$_2$, until ambient pressure is reached and the DLC deposited substrate is removed. Variables that affect DLC physical properties include: RF power, pressure, total gas flow, different gas ratios and cathode to upper plate spacing. Prior to DLC deposition, an Ar plasma is used to precondition the substrate surface for the deposition for 1-2 minutes. DLC deposition is typically done at ambient temperatures. DLC thickness and index of refraction can be measured directly using, for example, a pre-calibrated ellipsometer.

Next, the acoustic Bragg reflector is completed by depositing alternate layers of low and high acoustic impedance material 295-291. In one example, the thickness of the individual layers of low and high acoustic impedance materials 297-291 are chosen to be equal to one quarter wavelength of the resonant frequency of the device. Once the acoustic Bragg reflector 290 is complete the next step is to deposit the first resonator electrode 280. In one embodiment, the resonator electrode is sputter deposited. In one example, the material for the first electrode is molybdenum (Mo) although other materials will be apparent to those skilled in the art such as, but not limited to, Ti, W, Au, Pt or Al. In one example, the material for the resonator electrode, can be, a low thermoelastic loss and can have a thickness of less than 1000 A in order to maintain a smooth surface.

After the first resonator electrode 280 has been deposited the next step is to deposit the piezoelectric material 270. One material for the piezoelectric layer, can be, aluminum nitride (AlN) although other materials will be apparent to those skilled in the art such as, but not limited to, zinc oxide (ZnO) or lead zirconate titanate (PZT). In one example the AlN layer is reactively sputter deposited with nitrogen gas using an optimized process yielding a low stress, dense layer with a c-axis orientation. The thickness of the piezoelectric layer 270, can be, in the range from 0.1 to 10 microns.

Finally a top electrode 280 is deposited to complete the resonator 260. Again the top electrode, can be, a sputter deposited layer of Mo. The above embodiment is given as an illustrative example only, and is not intended to impose any limitations on the invention.

Figure 4:
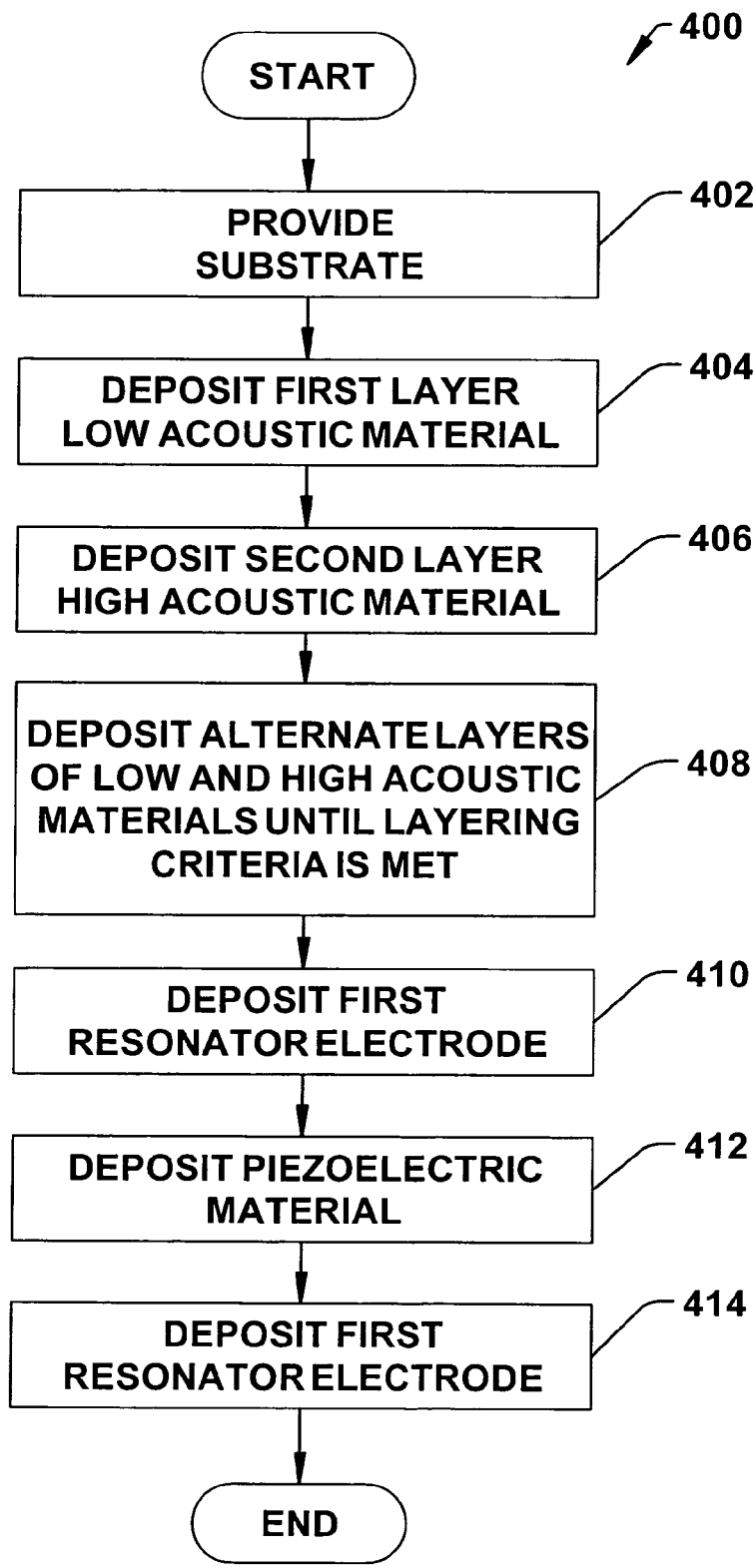
FIG. 4 is a flow diagram illustrating an example of a methodology for forming a SMR with an all dielectric acoustic Bragg reflector using the high acoustic impedance materials in accordance with one or more aspects of the present invention.

Turning to FIG. 4, a methodology 400 is illustrated for forming a Solidly Mounted Resonator (SMR) according to one or more aspects of the present invention. In particular, the SMR is formed with an all dielectric acoustic Bragg reflector using the high acoustic impedance materials disclosed. The SMR so formed may, for example, correspond to the SMR depicted in FIG. 3.

Although the methodology 400 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a SMR as illustrated and described below with respect to FIG. 3, as well as to devices not shown or described herein.

The Solidly Mounted Resonator (SMR) is formed upon a semiconductor substrate 300 that is provided at process step 402. The substrate 300 can be, for example, formed out of silicon such as a single crystal silicon wafer, GaAs, AlAs, and the like. At 404 a first layer of low acoustic impedance material 297 in FIG. 3. is deposited on the semiconductor substrate 300. The favored low acoustic impedance material is silicon oxide ($SiO_2$) than can be, for example, deposited in a chemical vapor deposition (CVD) process employing a deposition chamber. In a typical CVD process the semiconductor substrate is exposed to source gases such as a mixture of silane and $N_2O$, a liquid source such as TEOS, and the like. The source gases typically react and/or decompose on the semiconductor substrate surface to produce the necessary deposition layer. Any volatile derivatives that are also produced are typically removed by gas flow through the reaction chamber.

Other suitable novel low acoustic impedance materials belong to the range of materials used in advanced semiconductor devices to provide a low dielectric constant. These so-called low-k materials are usually based on spin-on siloxane monomers with additives to promote the formation of pores. The degree of porosity is generally related to the k or dielectric constant of the film. In the case of low acoustic impedance materials high porosity also means low density and low sound velocity, both of which translate into a low acoustic impedance. Suitable specific materials are nanoporous methyl silsesquioxane (MSQ), nano-porous hydrogensilsesquioxane (HSQ), nano-porous mixtures of MSQ and HSQ, nanoglass, aerogel, or a variety of other spin-on-glasses (SOG) with the deliberate addition of pores in the final film.

In FIG. 3, a second layer 296 of high acoustic impedance material is deposited on the first layer 297 of low acoustic impedance material at step 406 of method 400. The high acoustic impedance material can be, for example, silicon carbide (SiC), diamond-like carbon (DLC), Si-DLC, and the like. In one example a plasma CVD deposition chamber can be employed, utilizing, for example, a source gas mixture of methane ($CH_4$) and silane if SiC is to be deposited as the second layer of high acoustic impedance material. In the event diamond-like carbon (DLC) or Si-DLC is used instead of SiC then a modified deposition chamber, for example, can be employed. Diamond-like carbon can be deposited, for example, in a 150 mm parallel plate reactor radio frequency plasma enhanced chemical vapor deposition (RFCVD) chamber with the upper plate acting as the gas allocation source and the lower plate acting as the cathode on which the semiconductor substrate resides. In this configuration, for example, the upper plate is positive and the cathode is negative (grounded) and an RF source, for example, 13.56 MHz, can be coupled directly to the substrate through the negative cathode. After the chamber is evacuated, any hydrocarbon gas, typically but not limited to methane ($CH_4$), and/or a silicon containing hydrocarbon forming gas if Si-doping is required, typically but not limited to tetramethyidisiloxane (4MS), is introduced into the chamber until the desired pressure is achieved and flow is steady.

Other gases such as Argon (Ar) and Hydrogen ($H_2$) can be used additionally with the hydrocarbon forming gases to direct the chemical composition of the final diamond-like carbon film. At this point power is delivered to the cathode to cause plasma formation and the DLC is deposited for a predetermined time or until the preferred thickness is obtained, for example. The power is then shut off and inert gas is used to vent the chamber, typically Ar or $N_2$. Once ambient pressure is attained, the high acoustic impedance material layered substrate is removed. Variables that affect DLC physical properties include, for example, RF power, pressure, total gas flow, different gas ratios, cathode to upper plate spacing, and the like. Prior to DLC deposition, Argon plasma is used to pre-condition the substrate surface for the deposition for 1-2 minutes. DLC deposition is typically done at ambient temperatures. DLC thickness and index of refraction can be measured directly using a pre-calibrated ellipsometer. An ellipsometer is the most common way of measuring the thickness of thin films and is based on the detection of a phase shift of a polarized incident light beam during incidence and reflection from the surface.

At 408 of the illustrated method 400 alternate layers of low acoustic impedance material (297, 295, 293, and 291) and high acoustic impedance material 296, 294, and 292) are deposited on the layered substrate. The thickness of the various low and high impedance layers can be, for example chosen to be equal to one quarter wavelength of the resonant frequency of the device. Once the layer criteria at 408 have been met the acoustic Bragg reflector is complete and the method 400 continues at step 410. At step 410 the first layer of a resonant electrode 280 is deposited on the acoustic Bragg reflector that was fabricated at the end of step 408. The resonant electrode 280 can be, for example, sputter deposited by methods well known by those skilled in the art. Molybdenum is the favored material in one example; however other materials will be apparent to those skilled in the art, for example, Titanium (Ti), Tungsten (W), Gold (Au), Platinum (Pt), Aluminum (Al), and the like. In one example the material selected for the resonator electrode 280 preferably has a low thermoelastic loss and preferably has a thickness of less than 1000 Å in order to maintain a smooth resonator electrode 280 surface, for example.

After the first resonator electrode 280 at step 410 has been deposited the next step 412 is the deposit of the piezoelectric material 270, for example. Piezoelectric materials create an electric field when subjected to a change in dimension caused by an imposed mechanical force (known as piezoelectric or generator effect). On the other hand, an applied electric field to the piezoelectric material results in a mechanical stress (known as electrostrictive or motor effect). In one example, the material for the piezoelectric layer 270 can be Aluminum Nitride (Al—N) although other materials will be apparent to those skilled in the art such as Zinc Oxide (ZnO), Lead Zirconate Titanate (PZT), quartz (SiO2) or Barium titanate (BaTiO3) and the like. The Al—N layer can be reactively sputter deposited with nitrogen gas using an optimized process yielding a low stress, dense layer employing a c-axis orientation. The thickness of the piezoelectric layer can be in the range from about 0.1 to 10 microns.

Finally a top electrode may be deposited to complete the resonator at step 414. The top electrode 280 can again be a sputter deposited layer of Mo. The above method is given as an illustrative example only, and is not intended to impose any limitations on the invention.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A resonator apparatus, comprising:
a piezoelectric resonator; and
an acoustic Bragg reflector underlying the piezoelectric resonator; the acoustic Bragg reflector comprising a plurality of dielectric layers disposed directly on one another, where a first of the dielectric layers comprises a high acoustic impedance material, and a second of the dielectric layers abuts the first dielectric layer and comprises a low acoustic impedance material,
wherein the high acoustic impedance material comprises at least one of the following three types of material: silicon carbon (SiC), diamond-like carbon (DLC), and silicone doped diamond-like carbon (Si-DLC).

2. The resonator apparatus of claim 1, wherein the low acoustic impedance material comprises at least one of the following: silicon oxide ($SiO_2$), nano-porous methyl silsesquioxane (MSQ), nano-porous hydrogensilsesquioxane (HSQ), nano-porous mixtures of MSQ and HSQ, nanoglass, aerogel, and spin-on-glasses (SOG) with the addition of pores in the final film.

3. The resonator apparatus of claim 1, wherein a thickness of the first of the dielectric layers is fixed to be one quarter wavelength of the resonant frequency of the piezoelectric resonator.

4. The resonator apparatus of claim 1, wherein the thickness of the second of the dielectric layers is fixed to be one quarter wavelength of the resonant frequency of the piezoelectric resonator.

5. A method of forming a piezoelectric resonator with a Bragg reflector, the method comprising:
depositing a dielectric layer of low acoustic impedance material over a substrate, the low acoustic impedance material comprising at least one of the following materials: nano-porous methyl silsesquioxane (MSQ), nano-porous hydrogensilsesquioxane (HSQ), nano-porous mixtures of MSQ and HSQ, nanoglass, aerogel, spin-on-glasses (SOG) with the addition of pores in the final film, and spin-on siloxane monomers with additives to promote the formation of pores;
depositing a dielectric layer of high acoustic impedance material over the substrate;
depositing alternating dielectric layers of the low acoustic impedance material and the high acoustic impedance material until the Bragg reflector meets the required reflectivity;
depositing a first resonator electrode;
depositing a piezoelectric layer; and
depositing a second resonator electrode.

6. The method of claim 5, wherein the high acoustic impedance material is deposited in a plasma CVD deposition chamber with a gas comprising at least one of the following: a mixture of methane ($CH_4$) and silane, a mixture of methane and silicon; tetramethyldisiloxane (4MS), Argon (Ar) and $H_2$.

7. The method of claim 5, wherein the first resonator electrode material is sputter deposited with the first resonator electrode comprising at least one of the following: a molybdenum (Mo), titanium (Ti), tungsten (W), gold (Au), platinum (Pt) and aluminum (Al).

8. The method of claim 7, wherein the second resonator electrode material is sputter deposited with the second resonator electrode comprising at least one of the following: a molybdenum (Mo), titanium (Ti), tungsten (W), gold (Au), platinum (Pt) and aluminum (Al).

9. The method of claim 8, wherein the piezoelectric layer is aluminum nitride (Al—N), reactively sputter deposited with nitrogen gas using an optimized process yielding a low stress, dense layer with a c-axis orientation.

10. The method of claim 5, wherein the piezoelectric layer is a material comprising at least one of the following: aluminum nitride (Al—N), zinc oxide (ZnO) and lead zirconate titanate (PZT).

11. The method of claim 5, wherein the thickness of the piezoelectric layer is in the range from 0.1 to 10 microns.

12. The method of claim 5, wherein the high acoustic impedance material comprises at least one of the following: silicon carbon (SiC), diamond-like carbon (DLC), and silicone doped diamond-like carbon (Si-DLC).

13. The method of claim 5, wherein the second resonator electrode material is sputter deposited with the second resonator electrode material comprising at least one of the following: a molybdenum (Mo), titanium (Ti), tungsten (W), gold (Au), platinum (Pt) and aluminum (Al).

14. The method of claim 5, wherein the layer of high acoustic impedance material is SiC and the layer of high acoustic impedance material is deposited in a plasma CVD deposition chamber using a source gas mixture of methane ($CH_4$) and silane.

15. The method of claim 5, wherein the layer of high acoustic impedance material is diamond-like carbon (DLC) or silicone doped diamond-like carbon (Si-DLC) and the layer of high acoustic impedance material is deposited in a modified deposition chamber.

16. A method of forming a piezoelectric resonator with a Bragg reflector, the method comprising:
   depositing a dielectric layer of low acoustic impedance material over a substrate;
   depositing a dielectric layer of high acoustic impedance material over the substrate, wherein the high acoustic impedance material comprises at least one of the following: silicon carbon (SiC), diamond-like carbon (DLC), silicone doped diamond-like carbon (Si-DLC);
   depositing alternating dielectric layers of the low acoustic impedance materials and the high acoustic impedance materials until the Bragg reflector meets the required reflectivity;
   depositing a first resonator electrode;
   depositing a piezoelectric layer; and
   depositing a second resonator electrode;
   wherein the layer of high acoustic impedance material is deposited in a 150 mm parallel plate reactor RFCVD chamber with an upper plate being the gas distribution source and a lower plate being the cathode on which the substrate lies, the RF source of about 13.56 MHz is coupled directly to the substrate through the cathode.

* * * * *